US006496378B2

(12) United States Patent
Holce et al.

(10) Patent No.: US 6,496,378 B2
(45) Date of Patent: Dec. 17, 2002

(54) HOUSING SUITABLE FOR INTERCONNECTION TO A JUNCTION BOX AND A DUPLEX HOUSING

(75) Inventors: Kent Holce, Lake Oswego, OR (US); Frank Morey, Sherwood, OR (US); Matt Rupert, Lake Oswego, OR (US); Mark Bowman, McMinville, OR (US)

(73) Assignee: Veris Industries, LLC, Portland, OR (US)

( * ) Notice: Subject to any disclaimer, the term of this patent is extended or adjusted under 35 U.S.C. 154(b) by 0 days.

(21) Appl. No.: 09/963,169

(22) Filed: Sep. 25, 2001

(65) Prior Publication Data

US 2002/0005786 A1 Jan. 17, 2002

Related U.S. Application Data

(62) Division of application No. 09/636,296, filed on Aug. 10, 2000, now Pat. No. 6,331,821.

(60) Provisional application No. 60/145,616, filed on Jul. 26, 1999.

(51) Int. Cl.[7] ............................ H05K 7/18; H05K 7/12; H02G 3/08

(52) U.S. Cl. ....................... 361/752; 361/759; 361/801; 361/819; 174/50; 174/58

(58) Field of Search ................................ 361/736, 752, 361/759, 801, 819; 174/50, 50.51, 54, 57, 58; 220/4.02; 340/635

(56) References Cited

U.S. PATENT DOCUMENTS

| | | | | |
|---|---|---|---|---|
| 5,267,122 A | * | 11/1993 | Glover et al. | |
| 6,091,023 A | * | 7/2000 | O'Donnell | 174/57 |
| 6,414,241 B1 | * | 7/2002 | O'Donnell | 174/57 |

* cited by examiner

*Primary Examiner*—Jayprakash N. Gandhi
*Assistant Examiner*—Dameon E. Levi
(74) *Attorney, Agent, or Firm*—Chernoff Vilhauer McClung & Stenzel, LLP

(57) ABSTRACT

A combination current sensor and relay has an improved housing. In one aspect, the housing includes light emitting diodes on an upper surface that indicate open circuit and short circuit conditions. In another aspect, the housing includes a securement structure for a circuit board that includes the transformer and switches for device operation, together with aligned openings therein for routing wires to external devices. In another aspect, a multiple position switch is included on the upper surface that indicates multiple modes of operation of the device. In another aspect, the housing may be assembled in multiple parts by affixing a first portion to a support, a circuit board to the first portion, and a second portion to the first portion. In another aspect, the housing is suitable for engagement to alternatively a junction box and a duplex box. In another aspect, the configuration of the upper surface provides usability advantages.

14 Claims, 12 Drawing Sheets

HID SINGLE FIXTURE

PANEL MOUNTED RELAY AND INTERNAL SENSOR

HOUSING SUITABLE FOR INTERCONNECTION TO A JUNCTION BOX AND A DUPLEX HOUSING

This application is a division of Combination Current Sensor and Relay, U.S. patent application Ser. No. 09/636,296, filed Aug. 10, 2000, now U.S. Pat. No. 6,331,821 which claims the benefit of Combination Current Sensor and Relay, U.S. patent application Ser. No. 60/145,616, filed Jul. 26, 1999.

BACKGROUND OF THE INVENTION

The present invention relates to a housing for a combination current sensor and relay.

One of the trends in many industrial environments is to use an ever increasing number of electrical devices that include small motors, such as motors incorporated with fans. Typically such small motors only draw a limited amount of current, such as 1–10 amps. To provide fault detection for electrical devices having limited current requirements, a current sensor is electrically interconnected with the power cable to the electrical device to sense the electrical load current. The current sensor may include an electrical interconnection to a remotely located control panel to provide a signal to the control panel representative of the current within the power cable. It is desirable to locate such a current sensor within a housing, such as a starter housing within a substation. The current sensor or an associated relay may be interconnected to a separate starter, if desired. A relay is typically electrically interconnected between the remotely located control panel and the electrical device to receive a control signal from the control panel and in response selectively enable or disable power to the electrical device. Like the current sensor, such a relay may be located within the starter housing. In addition, the relay may function as the starter if the power rating of the relay is appropriate. Because of decreasing starter housing sizing, the relay and current sensor may be enclosed within a single unitary housing. Such a device is disclosed in U.S. Pat. No. 5,808,846, incorporated by reference herein.

Referring to FIG. 1, Functional Devices, Inc. of Russiaville, Ind. manufacturers a Model RIBXLSA combination current sensor and relay 10. Referring to FIG. 1, the device 10 includes a start/stop relay 12 that is energized or otherwise controlled by the digital output of a controller 14. Power from a power source 16 is provided by a wire 18 which is interconnected to the start/stop relay 12 of the device 10. The start/stop relay 12 is likewise interconnected to an internal sensor 20 by a wire 22, namely, a current sensor in the form of a transformer. The output of the internal sensor 20 is interconnected to a load 24 by a wire 26. The load 24 is interconnected to the source 16 by a wire 28. Accordingly, a loop for current flow is provided by wire 18, the start/stop relay 12, the wire 22, the internal sensor 20, the wire 26, and the wire 28. When the start/stop relay 12 is open, as a result of the controller 14, the power to the load 24 is interrupted (open circuit). Likewise, when the start/stop relay 12 is closed, as a result of the controller 14, power is provided to the load 24 (short circuit). Accordingly, the controller 14 may control power to the load 24 by energizing and de-energizing the start/stop relay 12. The device 10 may include a closedlopenlauto switch 21 for enabling the operation of the start/stop relay 12. Other applications Of the device 10, are illustrated in FIGS. 2 and 3. Asolid state switch 21 measures the current level to the load 24 and provides an open/closed signal to the controller 14 based on the current level.

Referring to FIG. 4, the combination current sensor and relay 10 Model RIBXLSA from Functional Devices, Inc. is packaged in a rectangular housing 40 with a threaded opening 42 on the lower portion though which are passed a pair of wires 18 and 26. The wires 18 and 26 are connected in series with the power Gable to the load as shown in FIGS. 1–3. Internal to the housing 40 are a set of four wire connectors I110 to which the control wires to the controller 14 are attached. To access the four wire connectors I110 the rear panel 44 is removed. The control wires may be passed through an opening 46 in the upper left hand side, an opening 48 in the upper right hand side, or both, as desired. The textual and graphical indication for which connectors correspond to the solid state switch 21 and to the relay 12 are provided on the back panel of the device. A set of three light-emitting-diodes 50, 52 and 54 are provided on the top of the housing 40. The right hand diode 54 provides an indication as to whether the relay is energized. The left hand pair of diodes 50 and 52 provides assistance in adjusting the set point for the current level of the solid state switch 21. When the central diode 54 is activated the current is over the trip point. When the leftt hand diode 50 is activated the current is under the tri point. A potentiometer that is accessed within the housing 40 when the back 44 is removed adjusts the set point for the switch 21. The switch 21 includes some hysteresis. To adjust the device 10, the potentiometer is decreased (tumed counterclockwise) until the central diode 52 turns on (may already be on). The potentiometer is then increased (turned clockwise) until the left hand diode 50 turns on. Then the potentiometer is decreased (turned counterclockwise) until the central diode 52 turns on. This properly adjusts the current level. The instructions for adjusting and the meaning for the light emitting diodes are provided within the housing 40. A closed/open/auto switch 56 is provided on the left hand panel of the housing 40. Likewise, the instructions for the settings of the switch 56 are provided on the back panel of the housing 40. The entire housing 40 is secured to a wall by a set of four screws at the corners thereof.

SUMMARY OF THE INVENTION

The present invention overcomes the aforementioned drawbacks of the prior art by providing a combination current sensor and relay with an improved housing. The housing has several aspects which result in improved functionality. In one aspect, the housing includes light emitting diodes on an upper surface that indicate open circuit and short circuit conditions. In another aspect, the housing includes a securement structure for a circuit board that includes the transformer and switches for device operation, together with aligned openings therein for routing wires to external devices. In another aspect, a multiple position switch is included on the upper surface that indicates multiple modes of operation of the device. In another aspect, the housing may be assembled in multiple parts by affixing a first portion to a-support, a circuit board to the first portion, and a second portion to the first portion. In another aspect, the housing is suitable for mangagement to alternatively a junction box and a duplex box. In another aspect, the configuration of the upper surface provides usability advantages.

DETAILED DESCRIPTION OF THE PREFERRED EMBODIMENT

The present inventors came to the realization that while the housing for the aforementioned combination current sensor and relay RIBXLSA is functional, it has limitations that become important when the device is mounted in a small enclosure, such as a starter housing within a substation.

First, the three status light emitting diodes are on the top surface of the housing making them difficult to observe if the device is mounted deep within a starter housing at any level other than the user's eye level. For example, when mounted in a starter housing near the floor, the user will need to excessively bend down to observe the light emitting diodes on the top of the housing. Also, when mounted in a starter housing near the ceiling, the light emitting diodes on the top surface may be obscured by the upper portion of the front panel. In addition, the textual and graphical indications for the meaning of each diode are provided on the back panel of the housing, which is not observable when mounted in the starter housing. Accordingly, the user must memorize the meaning of each of the diodes or carry an extra device to read the textual and graphical indications therefrom.

Second, the closed/openlauto switch is located on and independently secured to the side of the housing making it difficult to operate when the housing is mounted adjacent an upright left hand wall of the starter enclosure or another device. Also, the switch is difficult to observe if the user is not directly aligned with the left side of the housing. In addition, the textual and graphical indication for the meaning of the three settings of the switch is provided on the back panel of the housing, which is not observable when mounted in the starter housing. Accordingly, the user must memorize the meaning of each of the positions or carry an extra device to read the textual and graphical indications therefrom.

Third, the rear panel of the housing must be removed in order for the control wires to be installed. This necessarily requires the device not be mounted within the starter housing because when mounted the rear panel is secured to the wall of the starter housing. Unfortunately, it is cumbersome to install the control wires when the device is unmounted and thereafter mount the housing to the wall of the starter housing with the control wires attached. In addition, if the user is not careful the control wires may end up being to short to mount the device where intended. Further, the textual and graphical indication for the function of each of the connections for the control wires is provided on the back panel of the housing.

Fourth, the housing is installed on a flat surface, such as the back wall of a starter housing through a set of four openings provided therein. In addition, the present inventors came to the realization that such a combination current sensor and relay would be more versatile if mountable on a duplex box, a junction box, and a surface, and electrically connected thereto.

Figure 5:
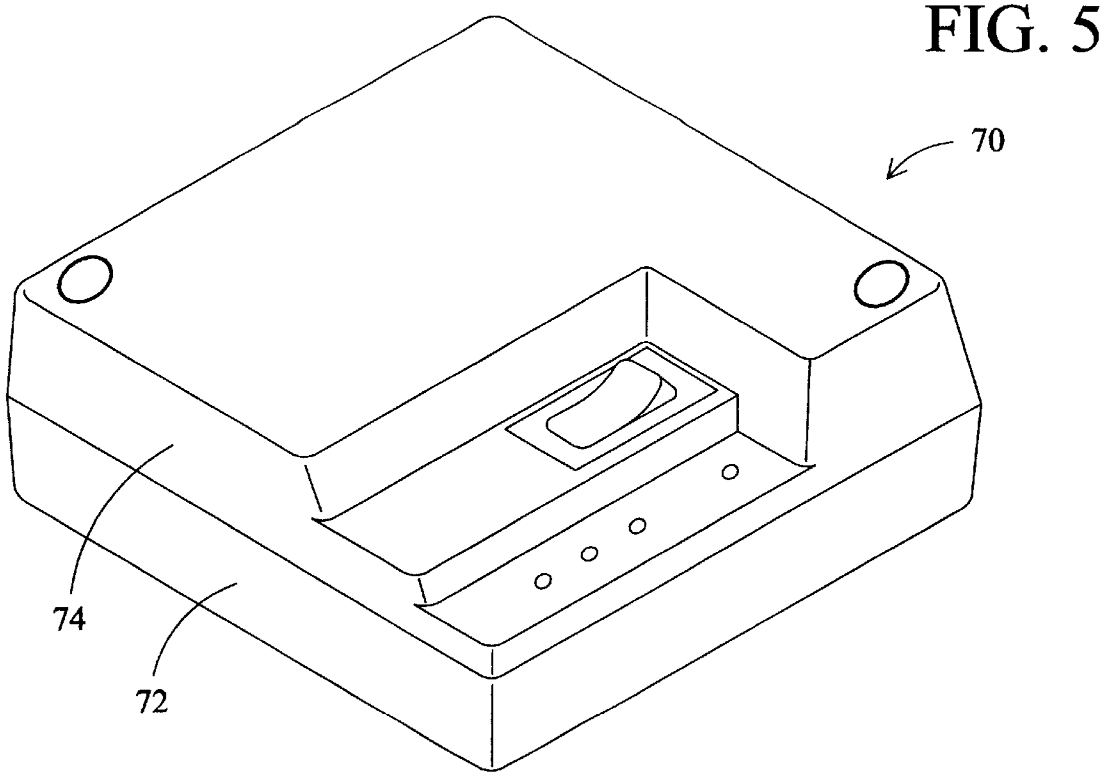
FIG. 5 is a pictorial view of an exemplary embodiment of a combination current sensor and relay housing of the present invention.
Figure 6:
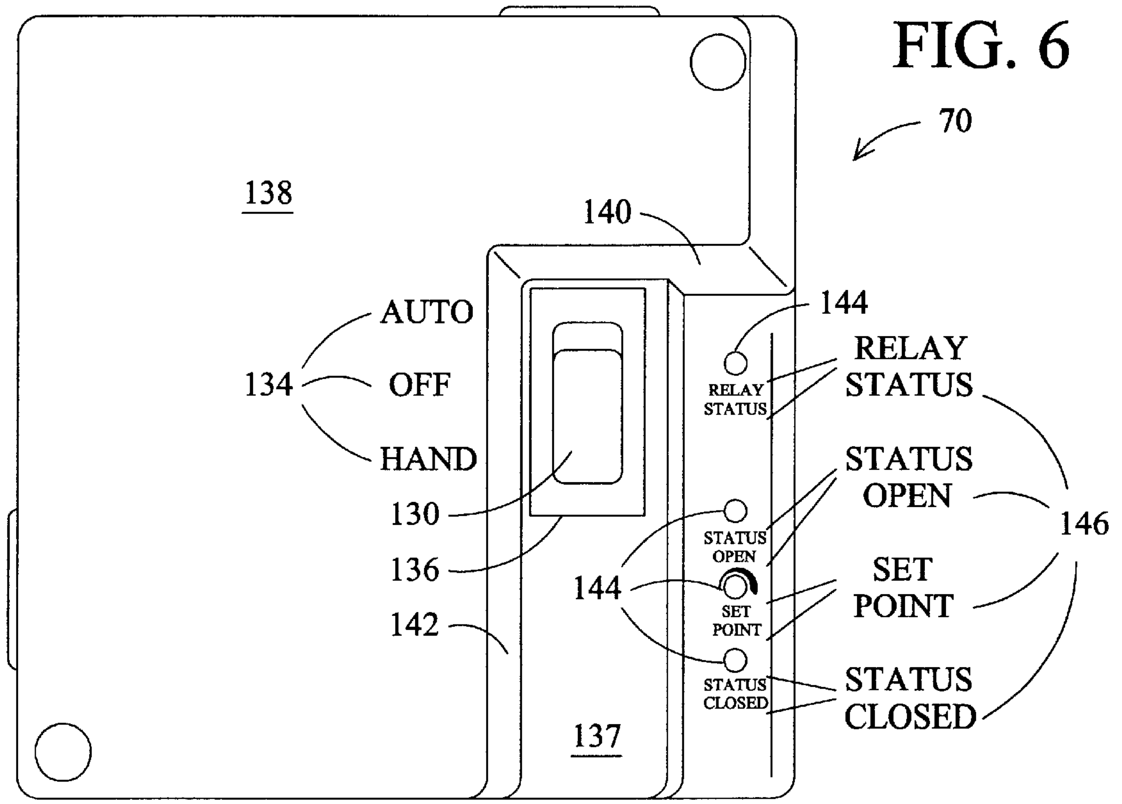
FIG. 6 is a top view of the housing of FIG. 5, including a base portion and a top portion.
Figure 7:
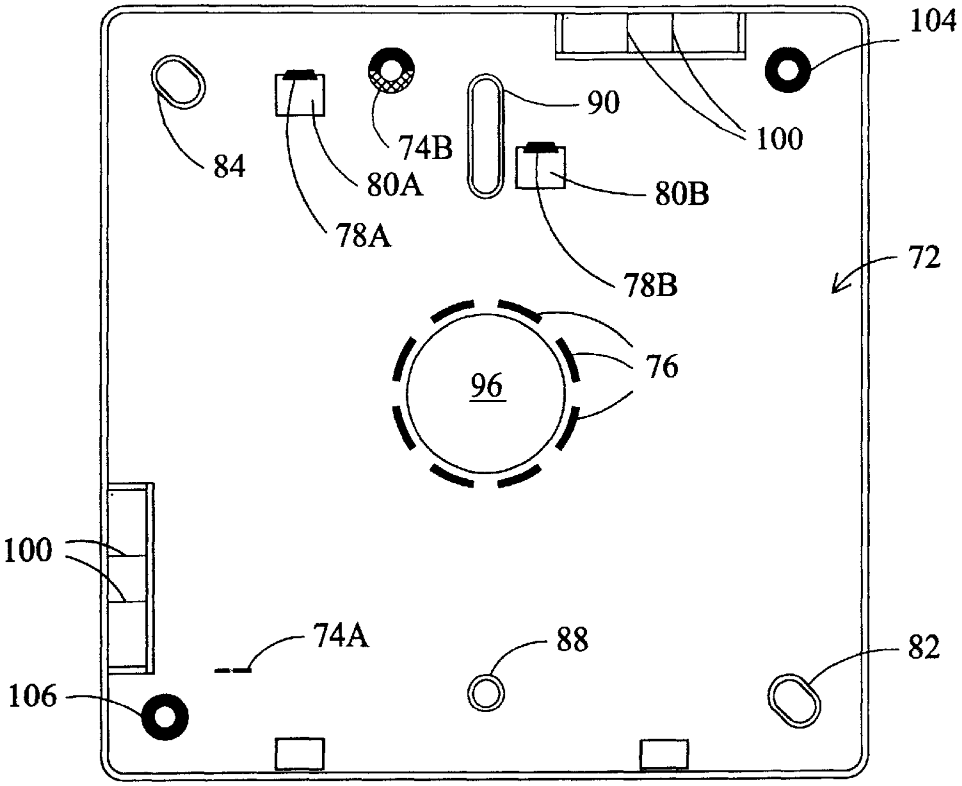
FIG. 7 is a top view of the base portion of FIG. 6.
Figure 8:
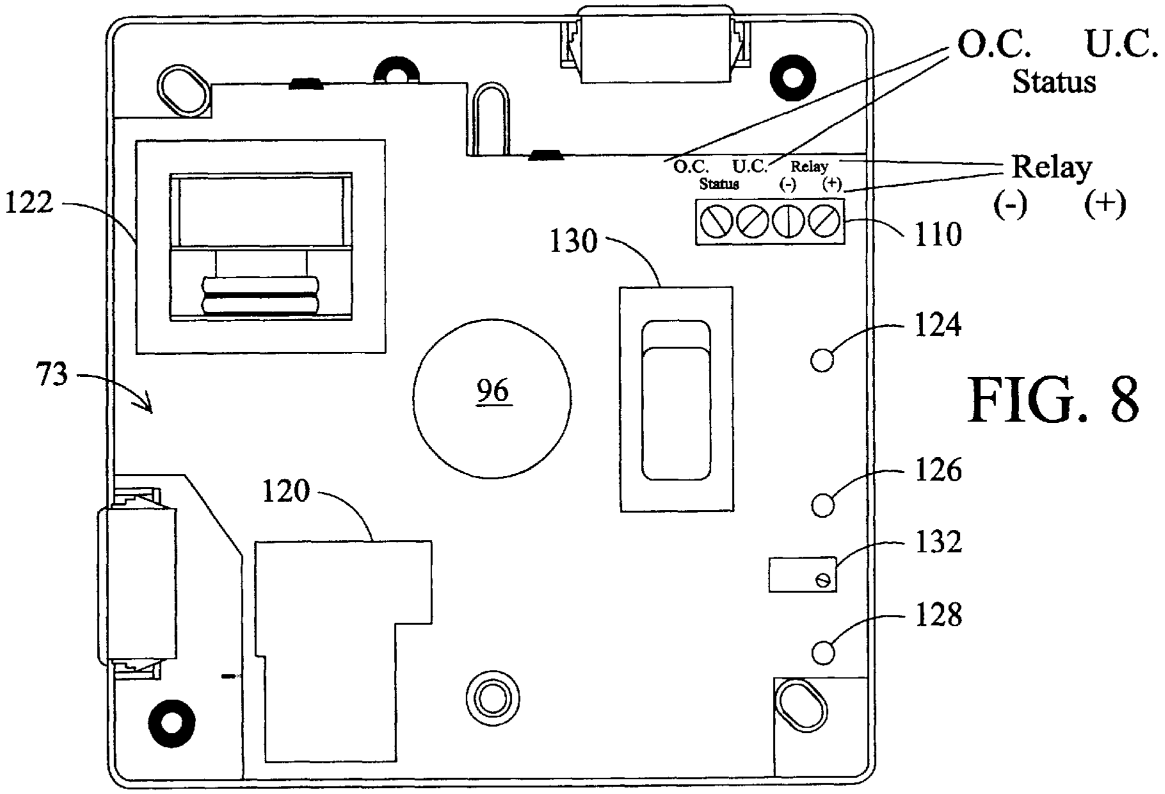
FIG. 8 is a top view of the base portion of FIG. 7 with a circuit board secured thereon.
Figure 9:
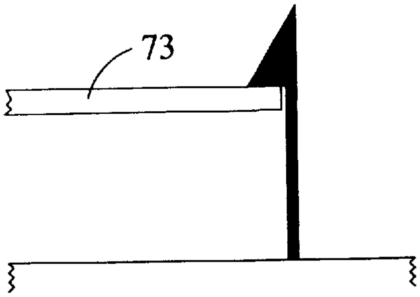
FIG. 9 is a side view of flexible members securing the circuit board to the base portion.

Referring to FIGS. 5 and 6, the improved housing 70 for a combination current sensor and relay of the present invention includes two separate portions, namely a base portion 72 and a top portion 74. Referring also to FIG. 7, the base portion 72 includes a pair of supports 74*a* and 74*b* and a central set of fingers 76 which supports an enclosed circuit board 73 (see FIG. 8). A pair of resilient members 78*a* and 78*b* flexibly bend and engage the circuit board with protrusions to secure it in place within the housing 70 on the supports. To remove the circuit board 73, the flexible resilient members 78*a* and 78*b* are pulled away from the circuit board 73 thereby releasing the circuit board 73 (see FIG. 9). This provides an easy way of removing the circuit board 73 from the housing 70 if it needs to be replaced, thereby alleviating the need to replace the entire device. In addition, a pair of openings 80*a* and 80*b* are provided in the back of the base portion 72 in front of the resilient members 78*a* and 78*b* (directly under the protrusions) so that the members may be pulled away from the circuit board 73 by prying with a suitable device, such as a small screwdriver, from the back of the device thereby releasing the circuit board 73.

Figure 10:
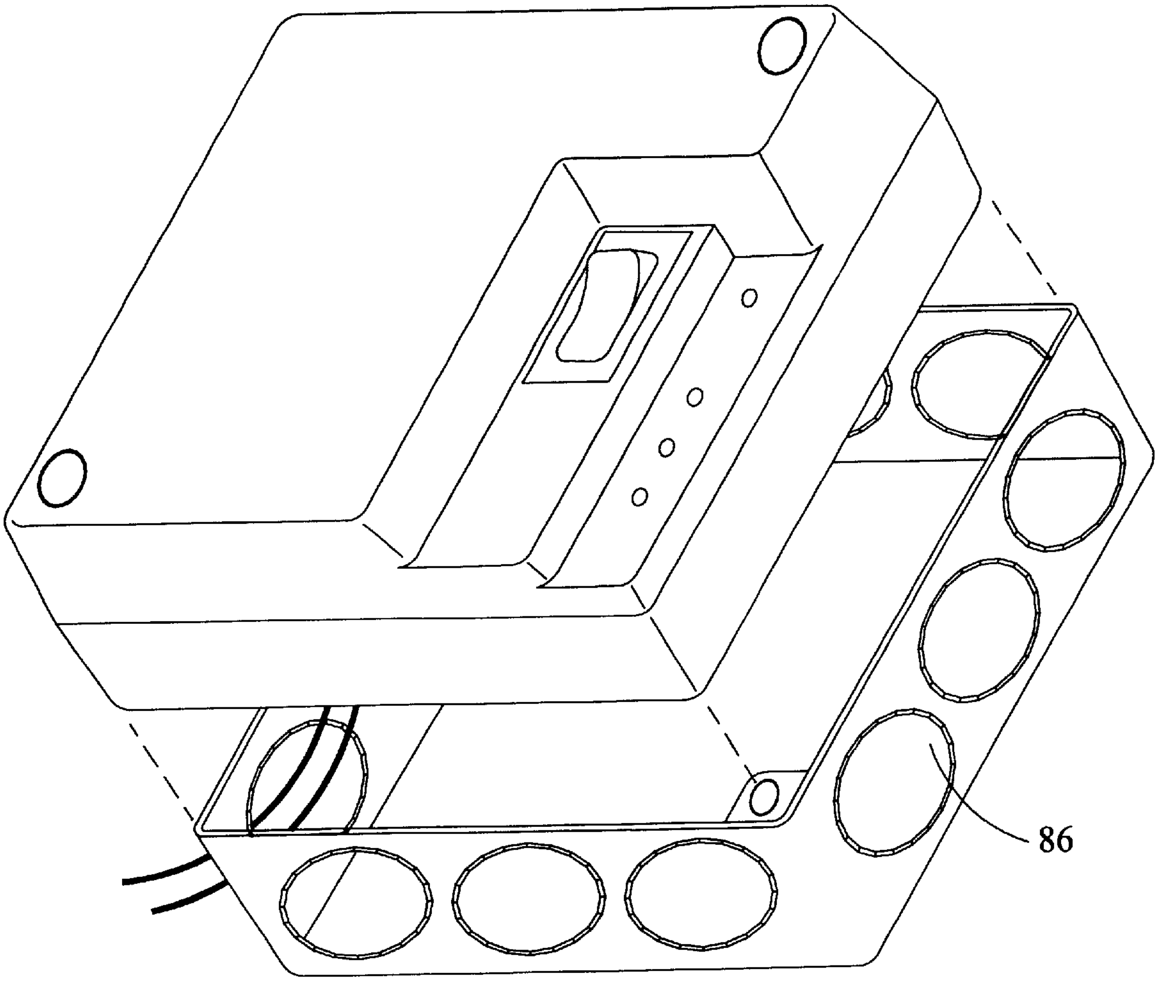
FIG. 10 is a pictorial view of the housing being secured to a 4S junction box.
Figure 11:
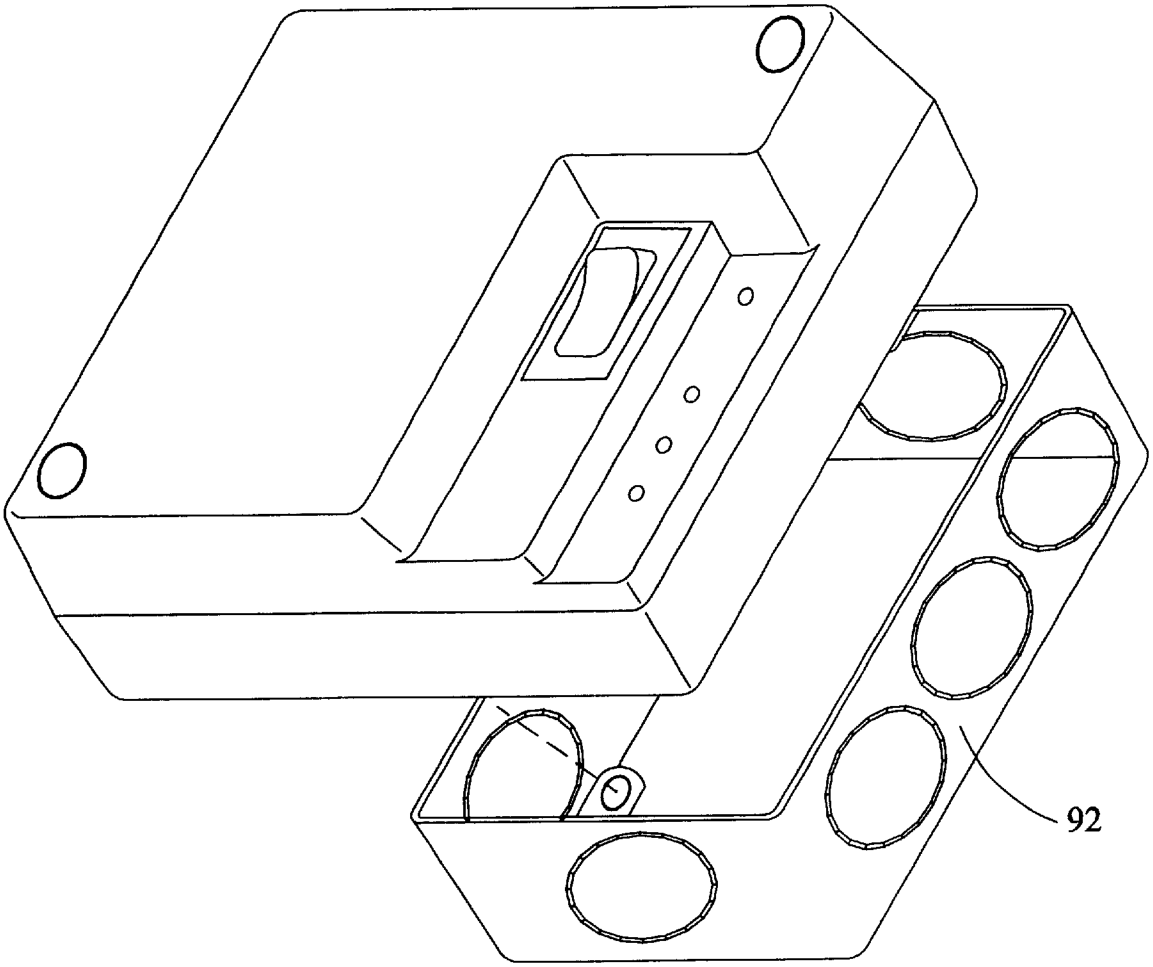
FIG. 11 is a pictorial view of the housing being secured to a duplex box.
Figure 12:
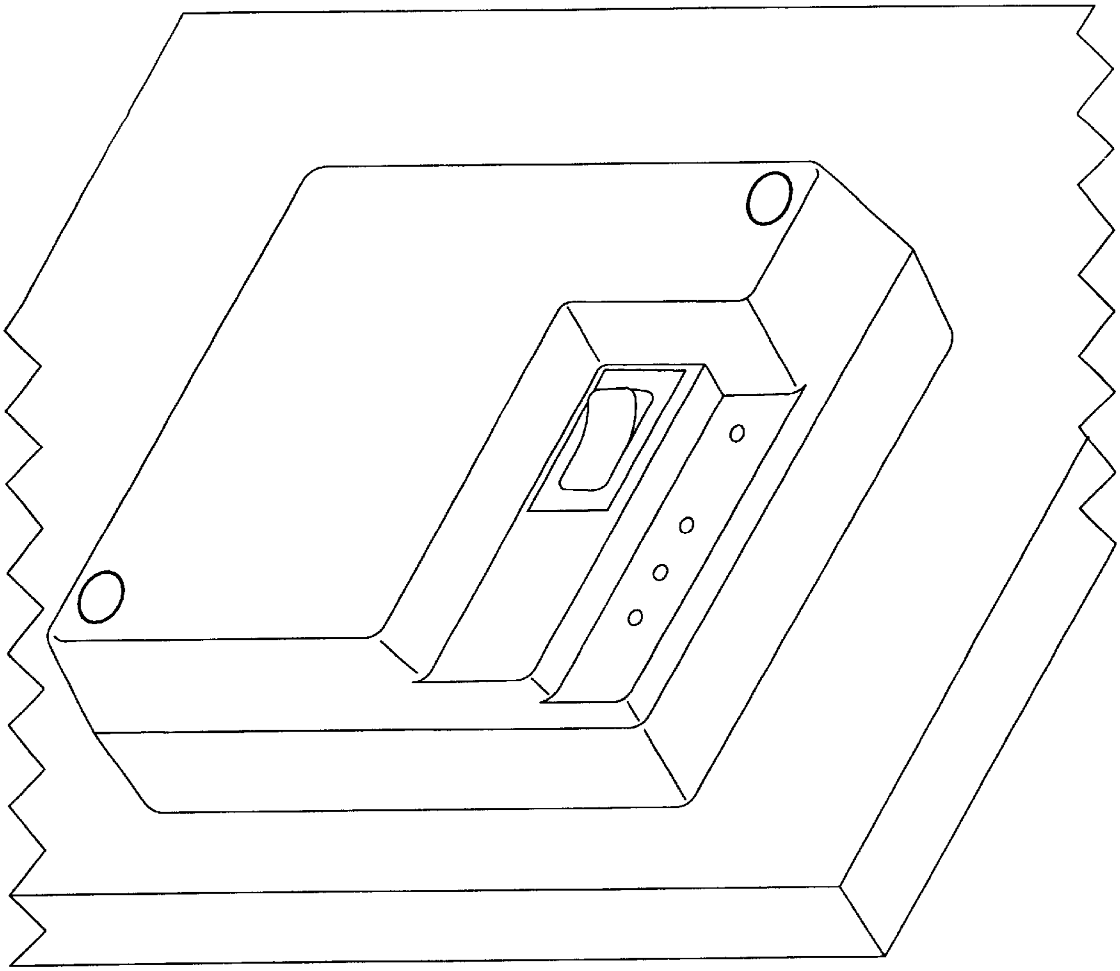
FIG. 12 is a-pictorial view of the housing being secured to a surface.

The base portion 72 includes a pair of openings 82 and 84 at the opposite corners thereof spaced at an appropriate location for securing the base portion 72 to a standard junction box, such as a 4S junction box 86 as shown in FIG. 10. The openings 82 and 84 are slightly oblong to permit a little movement of the base portion to make alignment of the openings 82 and 84 with the junction box 86 easier. The base portion 72 also includes a pair of openings 88 and 90 therein at the bottom and top of the central portion spaced at an appropriate location for securing the base portion 72 to a standard duplex box 92 as shown in FIG. 11. The top opening 90 is slightly oblong to permit a little movement of the base to make alignment of the openings 88 and 90 with the duplex box 94 easier. In addition, a central opening 96 is provided in the central portion of the base portion 72 to permit the routing of the power wires 18 and 26 therethrough for connection within the junction box 86 or duplex box 94. Without the central openirig 96 in the base portion 72, the device would need to be mounted to an adjacent surface with the power wires routed therefrom into the junction box or duplex box, which is inconvenient. Further, with multiple openings in the base portion 72, the same base portion 72 may be installed on multiple boxes, such as the duplex and junction boxes. This reduces the necessary inventory for users and increases the flexibility of the different uses for the device. In addition, with the wires routed through one or more of the openings in the sides thereof, the device may be mounted on a surface, such as a flat surface of a starter housing, as shown in FIG. 12.

Figure 13:
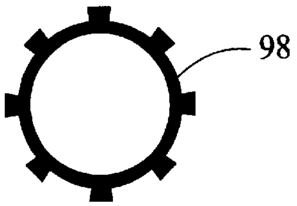
FIG. 13 is a top view of a threaded member.

The fingers 76 surrounding (in a circumferential relationship) the opening 96 are spaced to engage the protrusions of a threaded metal member 98 as shown in FIG. 13. The threaded metal member 98 is placed withinrthe fingers 76 and thereby prevented from rotating or substantial rotation. The engagement of a threaded member 98 to a pipe is normally performed by pressing engagement of the pipe thereon while turning the pipe. In addition, with the circuit board 73 supported by the fingers 76, the threaded member 98 will not become disengaged by raising above the fingers 76 when a pipe is rotatably pressingly engaged therewith.

The control and power wires may be routed through the openings in the sides, as necessary. The openings defined by both the top portion 74 and the base portion 72 include one or more ribs 100 which engage a protrusion of the threaded member 98 when supported therein. In addition, the ribs 100 are sufficiently recessed so that the face of the threaded member 98 is also in at least in partial face to face opposing relationship with the side. Accordingly, when the top portion 74 and base portion 72 are engaged with one another the threaded member 98 is prevented from significant rotational movement and also prevented from significant lateral movement. Thus the sufficiently threaded member 98 is retained-in place to secure a threaded member thereto.

The base portion 72 includes a pair of threaded posts 104 and I1Q6 to which a pair of screws are secured through the top portion 74 when engaged therewith. By securing the top portion 74 to the base portion 72, while the base portion 74 is secured to the supporting device, such as a surface or a box, the top portion 74 may be removed to allow access to the circuit board 73 therein without removal of the entire housing 70 from the supporting device or surface. Accordingly, the base portion 72 may be attached to a supporting surface. Then the circuit board 73 is detached to permit easier assess the central opening 96 in the base portion 73, if necessary. The power wires 18 and 26 are routed through the appropriate opening and the control wires are attached to the connectors 100 (see FIG. 8). Textual indications indicating the function of each connector 110 are provided on the circuit board 73 adjacent the connector, such as relay (+)(−) and status. Thus, when a user installs the control wires and power wires, the device may be previously secured in the desired location, so that the length of the controls wires and power wires may be accurately determined Also, the textual and/or graphical indications of the function of the control wires is provided next to the connectors so that it is less likely that the user will install the control wires improperly. In addition, without the need to search for the textual and/or graphical indications for the functions of the connectors 110 the user will likely install the connectors faster.

A relay 120, a transformer 122, a potentiometer 132, three light emitting diodes 124, 126, 128, the connectors 110, and a switch 130 are supported by the circuit board 73. Accordingly, when any of the electrical or mechanical devices fail, the entire circuit board 73 may be easily replaced as a single unit. This alleviates the need to troubleshoot individual components connected to different portions of the housing. The relay may be any type of switching circuit, as desired. The transformer may be directly connected in series or at least partially encircle the power cable. The relay and switch may be designed to sense any type of signal, such as a voltage, current, short circuit, and open circuit. The controller is preferably a programmable logic device.

Referring again to FIG. 6, the top portion 74 is secured to the base portion 72 with a pair of screws. The switch 130 is provided through an opening 136 in the top portion 74. Locating the switch 130 on the frontal surface permits easy access to the switch 130 and easy identification of the state of the switch. Textual and/or graphical indications 134 for the operation of the switch 130 are provided on the top member. The textual and/or graphical indications 134 of the operation of the switch 130 being provided on the front surface make it easy for the user to recall the operations of the switch, without the need to look at other uninstalled devices, a manual, or rely on the user's memory. In addition, the switch 130 is recessed from the upper surface 138 of the top portion 74 which reduces the overall height of the device while simultaneously locating the switch 130 at a location less likely to become inadvertently bumped thereby interrupting or unintentionally providing power to the load. The upper upright surface 140 above the left hand upright surface 142 partially surrounding the switch 130 provides a stop for a user's finger to hold the finger in position above the switch 130 so that the switch 130 may be more easily operated, especially when the user is wearing gloves. In addition, such upright surfaces 140 and 142 stop and maintain the finger of a user in position above the switch 130 while testing the electrical load even when the housing 70 is in an awkward location, such as the back of a starter housing.

The light emitting diodes 124, 126 and 128 and set point adjustment 132 (potentiometer) are provided through a set of openings 144 in the top portion 74. Locating the light emitting diodes on the front (upper) surface permits easy reading of the status and adjustment of the set point from the front of the housing 70. Textual and/or graphical indications 146 for the function of the set point and light emitting diodes are provided on the top portion 74. The textual and/or graphical indications 146 of the operation of the diodes and set point being provided on the front surface 148 make it easy for the user to recall the operation of the diodes and set point, without the heed to look at other devices nor open the device to adjust the set point. In addition, the set point and light emitting diodes are proximate the switch and recessed from the upper surface 138 of the top portion 74 and further recessed from the surface 137 with the switch 130. When the user is adjusting the switch 130 his finger will likely partially obscure from view the surface 148 proximate the light emitting diodes and set point. However, by further recessing the surface 148 proximate the light emitting diodes the user will be more likely to observe the status of the light emitting diodes by observing the diodes at an angle thereof under the finger. It is unlikely that the finger of a user on the switch will totally obscure the surface 148 further recessed therefrom.

Figure 1:
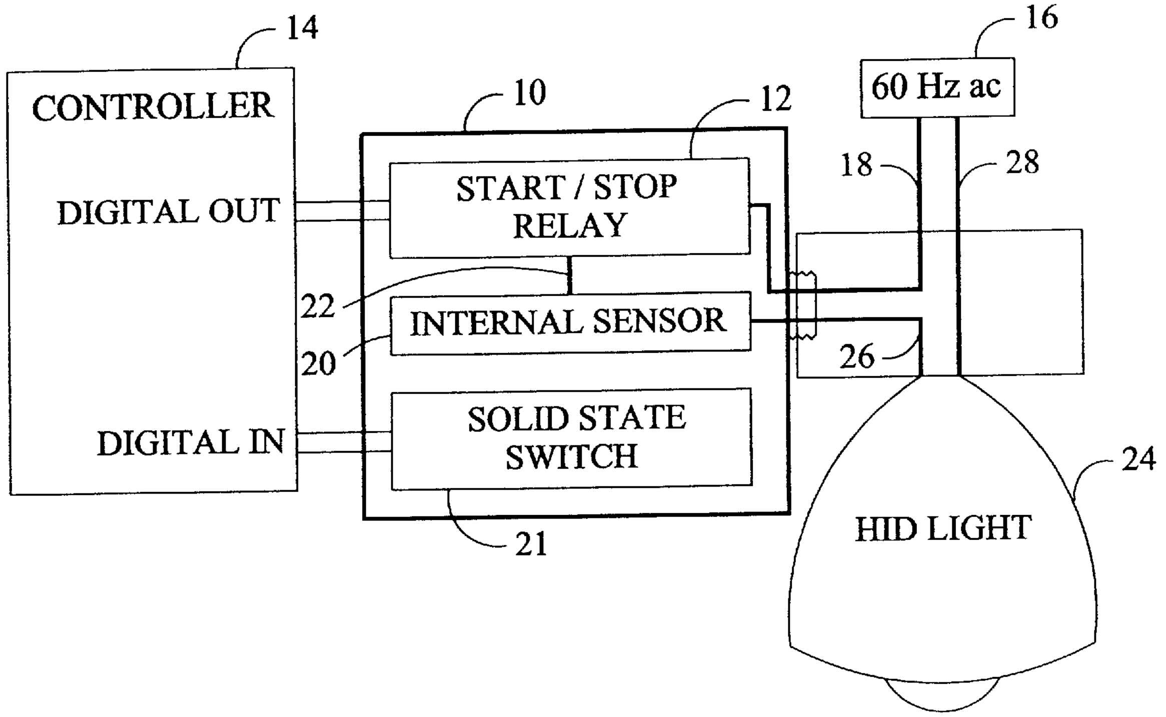
FIG. 1 PRIOR ART
FIG. 1 is a diagram of a HID single fixture with a combination current sensor and relay device.
Figure 2:
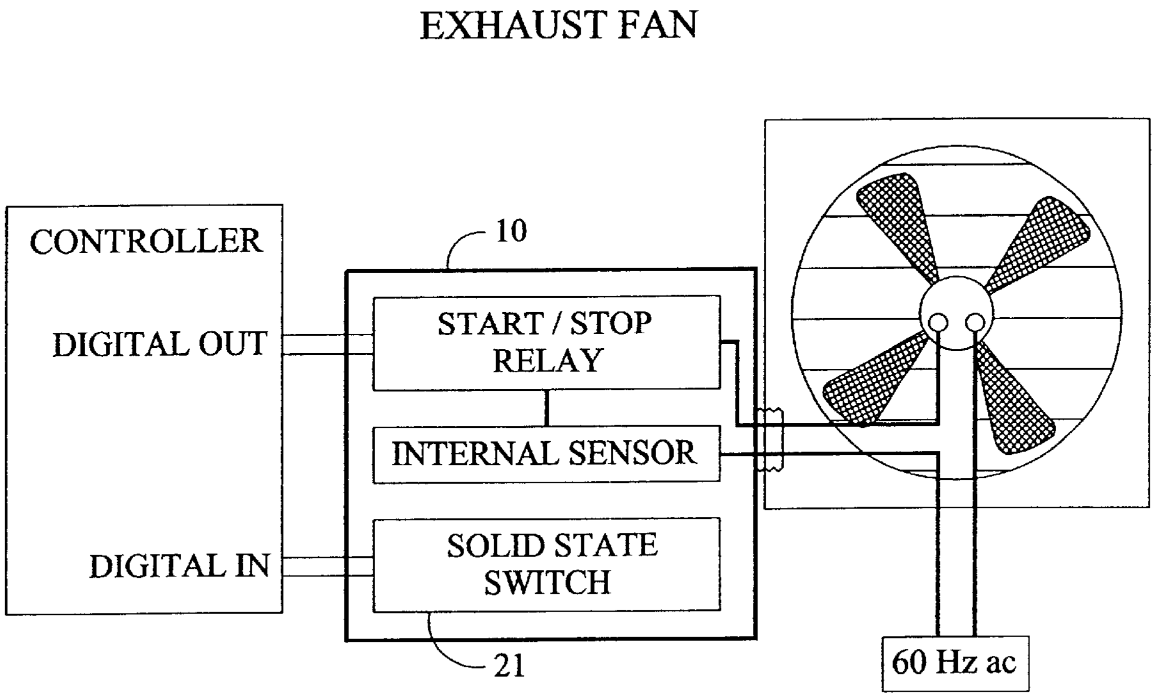
FIG. 2 PRIOR ART
FIG. 2 is a diagram of an exhaust fan with a combination current sensor and relay device.
Figure 3:
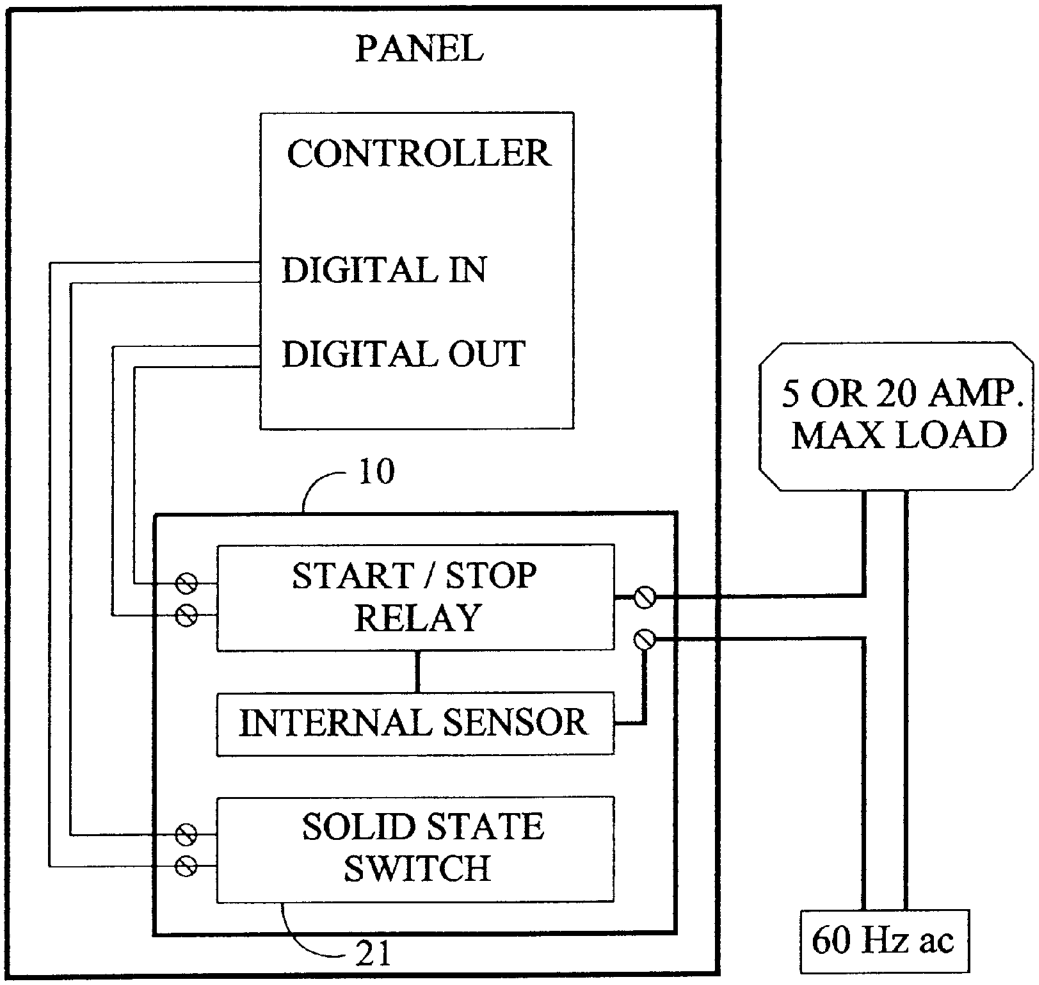
FIG. 3 PRIOR ART
FIG. 3 is a diagram of a panel mounted combination current sensor and relay device.
Figure 4:
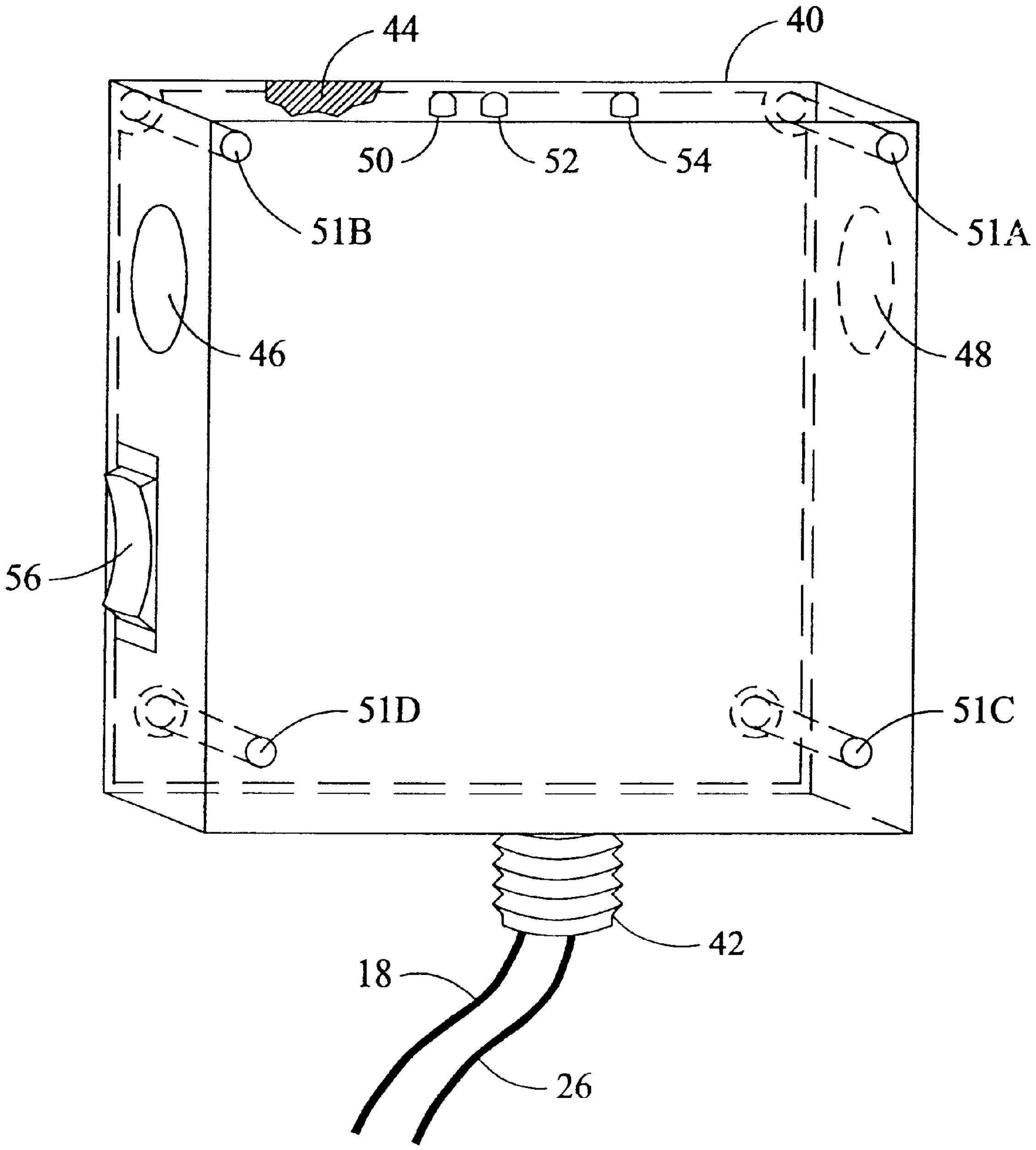
PRIOR ART FIG. 4
FIG. 4 is a pictorial view of a combination current sensor and relay.
Figure 14:
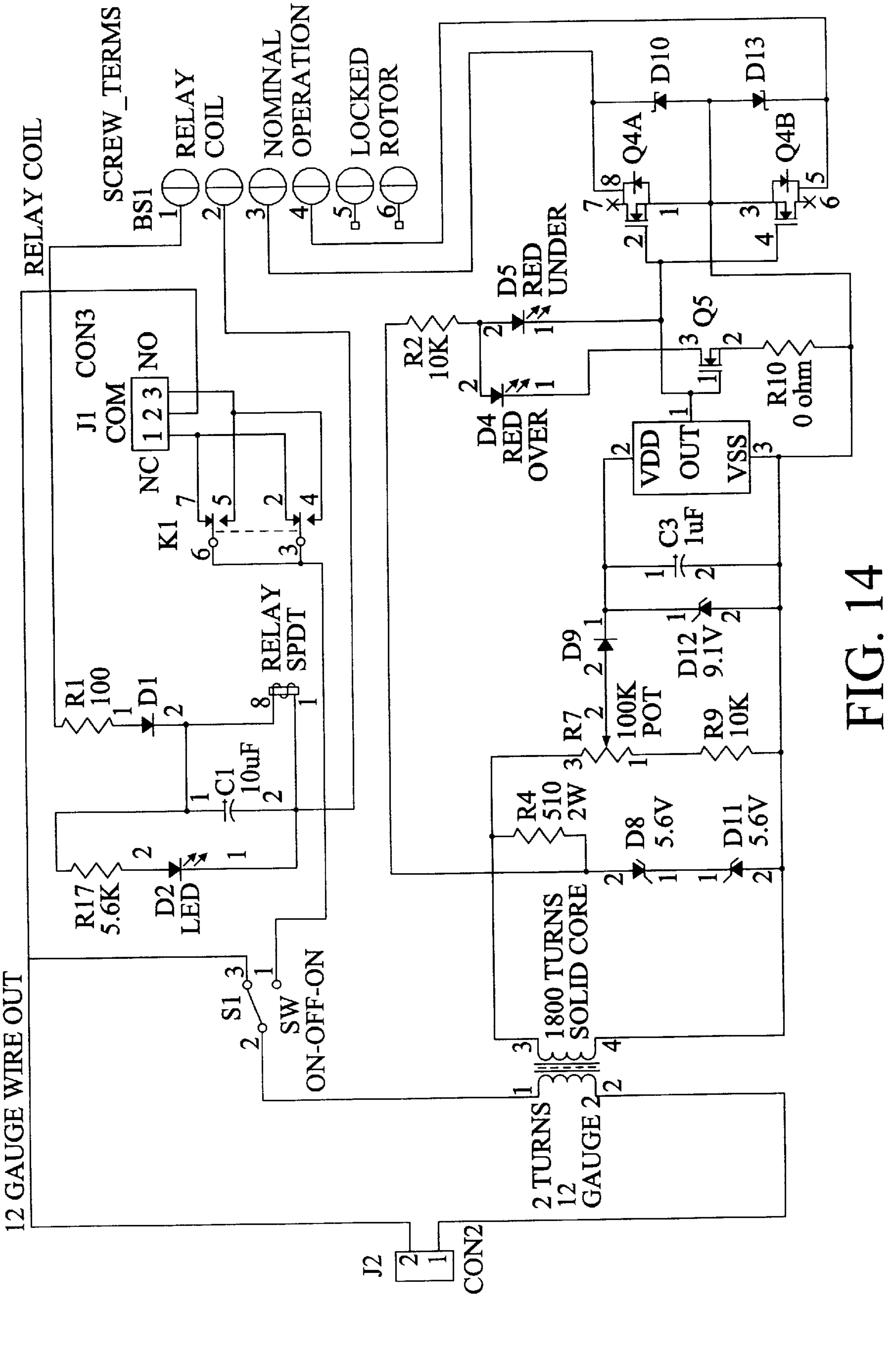
FIG. 14 is an exemplary circuit diagram for the present invention.

Referring to FIG. 14, an exemplary circuit (similar in functionality to FIGS. 1–3) includes a start/stop relay, an internal current sensor, and a switch circuit. The power cables are interconnected to a terminal block. The terminal block is interconnected to a switch circuit that provides an on-off-on functionality. With the switch in the upper position, referred to as the hand mode, the terminal block is electrically connected across a transformer with the startustop relay effectively removed from the circuit. Any power from the source to the load is provided without interference by the combination current sensor and relay device. With the switch in the central position, referred to as the off mode, the terminal block is open circuited. Any power from the source to the load is open circuited. With the switch in the lower position, referred to as the auto mode, the electronics are enabled. Any power from the source to the load is provided dependent on the status provided to the relay coil contacts from the controller.

For the auto mode the connection of the contact jumper provides either a normally closed or normally open functionality. Interconnecting pins 1 and 2 provides a normally dosed condition to the relay, while interconnecting pins 2 and 3 provides a normally open condition to the relay. The power from the controller is preferably 24 volts, either AC or DC. If the input signal is AC then diode DI rectifies the signal and provides a DC voltage between the capacitor and the resistor. Light emitting diode D2 provides a status indication to the user that the relay is energized. Energizing or de-energizing the relay changes its state and hence whether the circuit to the load is open or short circuited.

The primary of a transformer, generally referred to herein as an internal current sensor, is electrically interconnected between the switch and the terminal block. The secondary of the transformer provides a current (or voltage) signal representative of the current flowing between the terminals of the terminal block, and hence to the load. A pair of diodes provides alternating current clipping at 6.3 volts to protect the remaining portions of the circuit and also provide a reference voltage at the upper terminal of the secondary of the transformner. A scaling resistor and potentiometer provides a scaled voltage at the base of the diode. The diode and capacitor provide a ½ wave rectifier functionality. A diode clamps the voltage to a maximum of 9.1 volts. A positive voltage detector, such as a 4.1 volt detector, interconnects VDD to the output when the difference across its terminals is greater than approximately 4.1 volts. The positive voltage detector interconnects VSS to the output when the difference across its terminals is less than approximately 4.1 volts. The PDD has some built in hysteresis to avoid repetitively switching near the switching point, such as 4.1 volts. When the output of the PDD is high then transistor Q5 is activated with diode D4 indicating an over current situation. When the output of the PDD is low then transistor Q5 is not activated and diode D5 is activated indicating an under current situation. By adjustment of the potentiometer in combination with the diode indications, the suitable current level may be obtained.

When the output of the PDD is high then transistors Q4A and Q4B are activated thereby shorting the status terminals together. This permits DC or AC current to flow between the contacts. A pair of diodes provides excess voltage protection, such as 47 volts. When the output of the PDD is low then Q4A and. Q4B are not activated thereby providing an open circuit between the terminals.

Figure 15A:
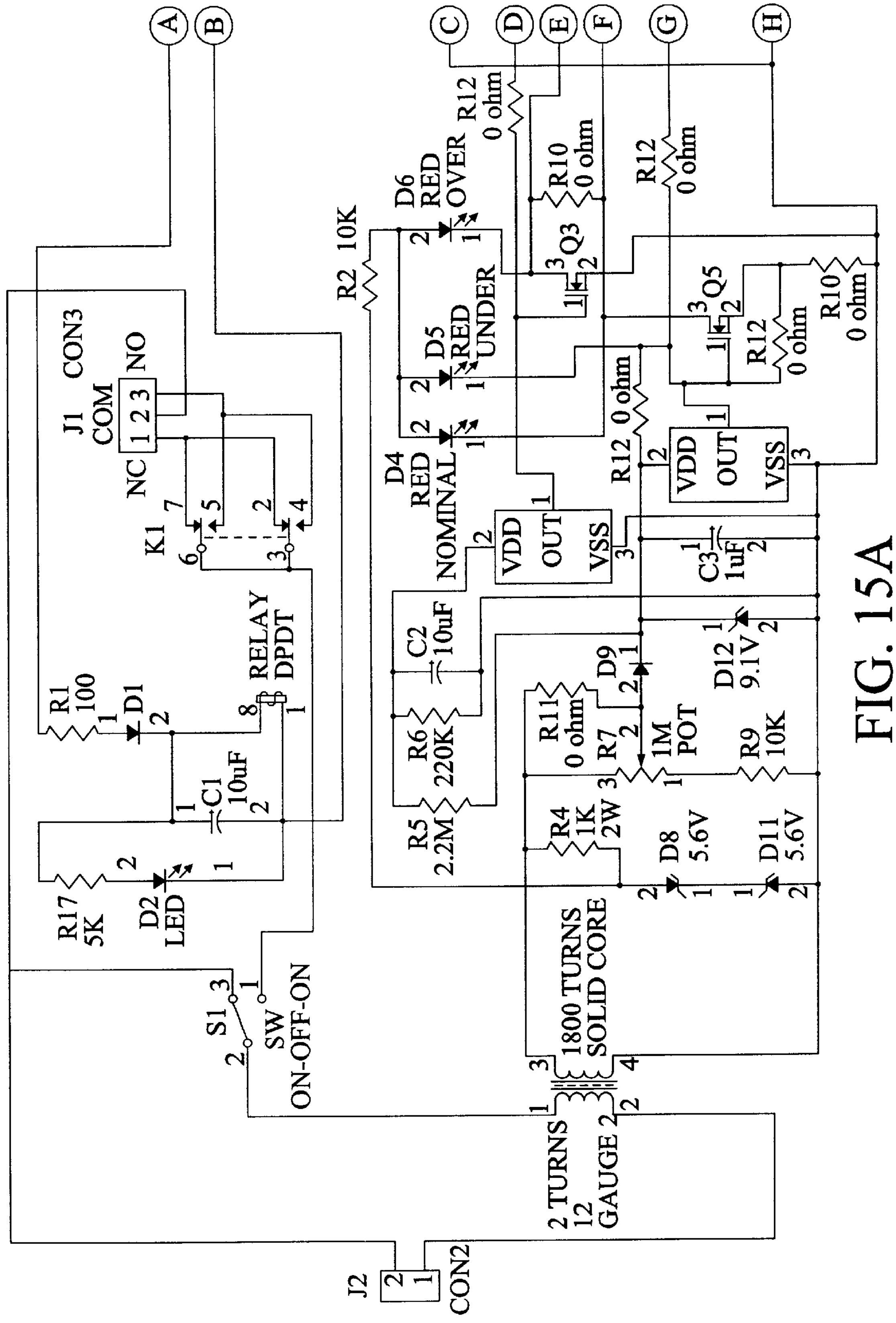
FIGS. 15A and 15B is an alternatively exemplary circuit diagram for the present invention.
Figure 15B:
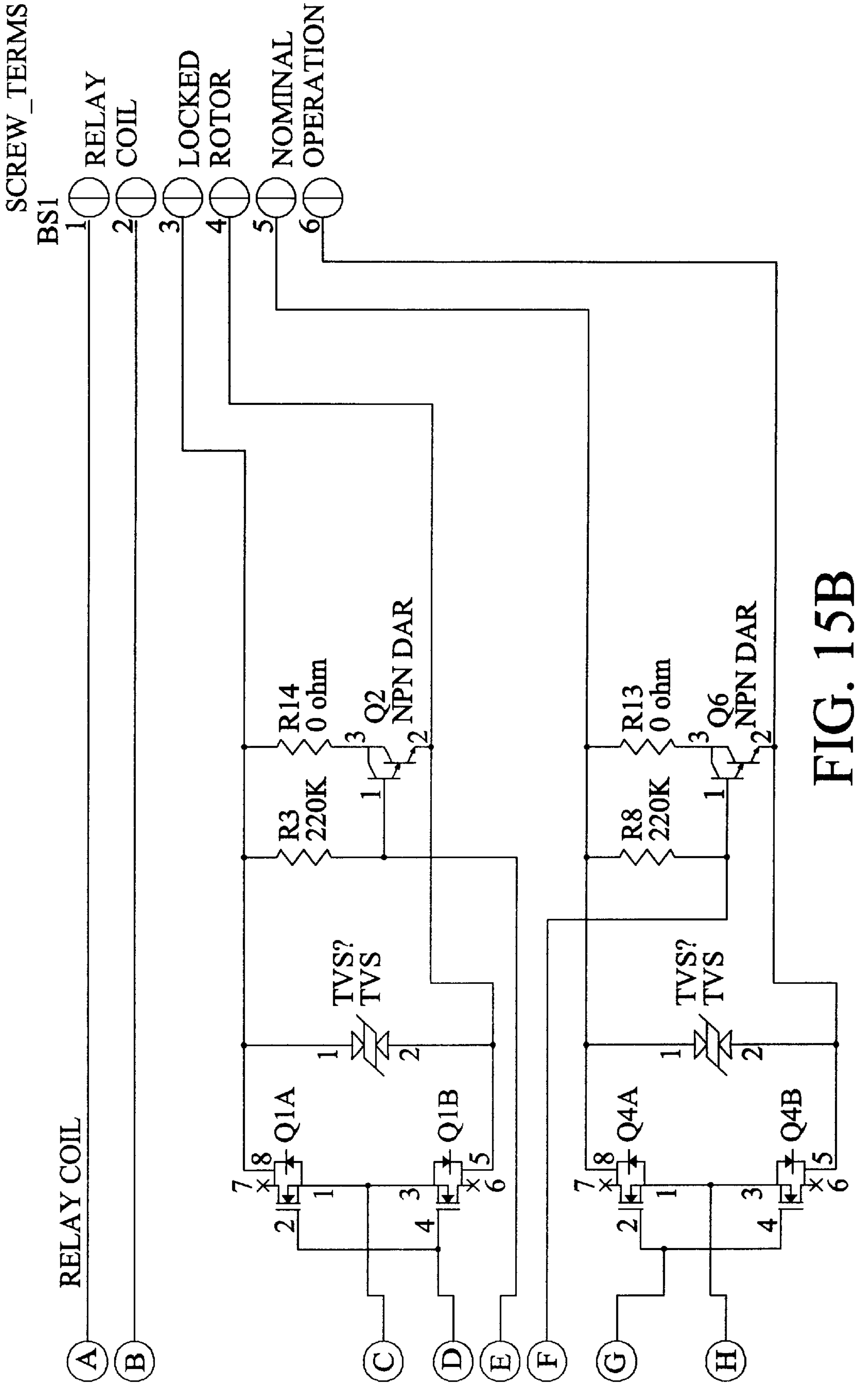

Referring to FIGS. 15A and 15B, an altemative circuit provides an additional set of contacts. Preferably the upper PDD and associated circuit provides an over current indication, such as a locked rotor. Preferably the lower PDD and associated circuit provides an under current indication, such as a belt loss. Accordingly, the output terminals provide both an over current and an under current indication. It is noted that the field effect transistors are provided for a normally open circuit and alternatively the npn bipolar transistors are provided for normally closed circuit. Both are not typically simultaneously included, or otherwise electrically interconnected, in an actual circuit.

The terms and expressions that have been employed in the foregoing specification are used as terms of description and not of limitation, and there is no intention, in the use of such terms and expressions, of excluding equivalents of the features shown and described or portions thereof, it being recognized that the scope of the invention is defined and limited only by the claims that follow.

What is claimed is:

1. A housing comprising:

(a) said housing having a first portion and a second portion;

(b) said first portion having a first side defining a first securement structure including at least a first opening to interconnect said housing to a junction box and a second securement structure including at least a second opening to interconnect said housing to a duplex box, wherein said first opening is spaced apart from said second opening;

(c) said first side of said first portion defining an opening therein suitable for a plurality of wires to pass therethiough into said junction box and said duplex box when said housing is secured to one of said junction box and said duplex box; and (d) said first portion detachably engageable to said second portion.

2. The housing of claim 1 further comprising:

(a) a plurality of fingers in a circumferential relationship to said opening; and (b) said plurality of fingers supporting a circuit board engaged with said first portion.

3. A housing comprising:

(a) said housing having a first portion and a second portion;

(b) said first portion defining a securement structure suitable to interconnect said housing to alternatively a junction box and a duplex box;

(c) said first portion defining an opening therein suitable for a plurality of wires to pass therethrough into said junction box and said duplex box when said housing is secured to one of said junction box and said duplex box;

(d) said first portion detachably engageable to said second portion;

(e) a plurality of fingers in a circumferential relationship to said opening;

(f) said plurality of fingers suitable to support a circuit board engaged with said first portion; and (g) a threaded member with protrusions spaced to engage said plurality of fingers when located within the periphery of said plurality of fingers.

4. The housing of claim 3 wherein said threaded member is prevented from substantial relation when engaged with said plurality of fingers.

5. The housing of claim 4 wherein said circuit board prevents said threaded member from becoming disengaged from said plurality of fingers when said circuit board is engaged with said first portion.

6. A housing comprising:

(a) said housing having a first portion and a second portion;

(b) said first portion defining a securement structure suitable to interconnect said housing to alternatively a junction box and a duplex box;

(c) said first portion defining an opening therein suitable for a plurality of wires to pass therethrough into said junction box and said duplex box when said housing is secured to one of said junction box and said duplex box;

(d) said first portion detachably engageable to said second portion; and (e) said first portion and said second portion together define a side opening in the side of said housing.

7. The housing of claim 6 wherein said side opening is defined by a pair of sidewalls of at least one of said first portion and said second portion.

8. The housing of claim 7 further comprising a plurality of ribs defined between said pair of sidewalls and a treaded member with protrusions spaced to engage said plurality of ribs when located within said side opening.

9. The housing of claim 8 wherein said pair of sidewalls retain said threaded member from becoming disengaged from said housing when retained by said side opening.

10. The housing of claim 8 wherein said threaded member is in at least partial face-to-face opposing relationship said sidewalls.

11. The housing of claim 8 wherein said threaded member is prevented from significant rotational movement by said plurality of ribs.

12. A housing comprising:

(a) said housing having a first portion and a second portion;

(b) said first portion defining a securement structure suitable to interconnect said housing to alternatively a junction box and a duplex box;

(c) said first portion defining an opening therein suitable for a plurality of wires to pass therethrough into said junction box and said duplex box when said housing is secured to one of said junction box and said duplex box;

(d) said first portion detachably engageable to said second portion;

(e) said second portion defining an upper surface defining an opening therein for a multiple position switch;

(f) at least one of a first textual and a first graphical indication affixed to said upper surface and proximate said multiple position switch opening indicating a first mode of operation;

(g) at least one of a second textual and a second graphical indication affixed to said upper surface and proximate said multiple position switch opening indicating a second mode of operation; and (h) at least one of a third textual and a third graphical indication affixed to said upper surface and proximate said multiple position switch opening indicating a third mode of operation.

13. The housing of claim 12 wherein said upper surface further comprises:

(a) a first surface;

(b) a second surface recessed from said first surface defining said multiple position switch opening; and (c) a first upright surface interconnecting said first surface and said second surface wherein said upright surface is "L" shaped.

14. The housing of claim 13 wherein said upper surface further comprises:

(a) a third surface recessed from said second surface defining a plurality of openings therein;

(b) a second upright surface interconnecting said second surface and said third surface; and (c) said third surface terminating on at least one side with a side of said housing.

* * * * *